United States Patent
Kim et al.

(10) Patent No.: US 7,859,102 B2
(45) Date of Patent: Dec. 28, 2010

(54) MULTI-LAYER STACKED WAFER LEVEL SEMICONDUCTOR PACKAGE MODULE

(75) Inventors: Sung Min Kim, Seoul (KR); Chang Jun Park, Gyeonggi-do (KR); Kwon Whan Han, Seoul (KR); Seong Cheol Kim, Seoul (KR); Hyeong Seok Choi, Seoul (KR); Ha Na Lee, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 113 days.

(21) Appl. No.: 12/048,304

(22) Filed: Mar. 14, 2008

(65) Prior Publication Data

US 2009/0166853 A1  Jul. 2, 2009

(30) Foreign Application Priority Data

Jan. 2, 2008   (KR) ..................... 10-2008-0000303

(51) Int. Cl.
  *H01L 23/36* (2006.01)
(52) U.S. Cl. ................. 257/712; 257/686; 257/E23.101
(58) Field of Classification Search ................. 257/686, 257/712, E23.101
  See application file for complete search history.

(56) References Cited

U.S. PATENT DOCUMENTS 6,750,545 B1 *  6/2004  Lee et al. ..................... 257/777

2005/0194674 A1 *  9/2005  Thomas et al. .............. 257/690

FOREIGN PATENT DOCUMENTS

KR   1020010055041 A   7/2001
KR   100650763 B1   11/2006

* cited by examiner

*Primary Examiner*—Evan Pert
*Assistant Examiner*—Krista Soderholm
(74) *Attorney, Agent, or Firm*—Ladas & Parry LLP

(57) ABSTRACT

A stacked wafer level semiconductor package module includes a semiconductor chip module including first and second semiconductor chips each having a rectangular shape. The first semiconductor chip has first pads disposed along a first short side of a lower surface thereof. The second semiconductor chip has second pads disposed along a first short side of a lower surface thereof. The first and second semiconductor chips are stacked so as to expose the first pad and the second pad on one side of the stacked first and second semiconductor chips. The package also includes a substrate having a first connection pad facing the first pad and a second connection pad facing the second pad. The package also includes a first connection member for connecting the first pad to the first connection pad, and a second connection member for connecting the second pad to the second connection pad.

13 Claims, 6 Drawing Sheets

MULTI-LAYER STACKED WAFER LEVEL SEMICONDUCTOR PACKAGE MODULE

CROSS-REFERENCE TO RELATED APPLICATIONS

The present application claims priority to Korean patent application number 10-2008-0000303 filed on Jan. 2, 2008, which is incorporated herein by reference in its entirety.

BACKGROUND OF THE INVENTION

The present invention relates generally to a stacked wafer level semiconductor package module.

Recently, a semiconductor package having a semiconductor chip capable of storing massive amounts of data and processing the data in a short period of time has been developed.

A chip scale package having no more than 100% to 105% the volume of a semiconductor chip has been developed. One such chip scale package is a wafer level package that utilizes redistribution.

Recent developments also include a semiconductor package module in which a plurality semiconductor packages are mounted on a printed circuit board. The semiconductor package module is coupled to various devices, such as a computer, and performs a various functions.

However, according to conventional wafer level packages it is difficult to stack the wafer level packages because a solder ball is attached to a redistribution disposed on a side surface of a semiconductor chip.

SUMMARY OF THE INVENTION

Embodiments of the present invention are directed to a stacked wafer level package module in which a plurality of wafer level packages are stacked over a substrate.

In one embodiment, a stacked wafer level semiconductor package module comprises a semiconductor chip module including a first rectangular shaped semiconductor chip having an upper surface and a lower surface opposite the upper surface, each surface having a pair of short sides and a pair of long sides, the first rectangular shaped semiconductor chip comprising: a first pad disposed along a first lower surface short side of the first rectangular shaped semiconductor chip, and a second rectangular shaped semiconductor having an upper surface and a lower surface opposite the upper surface, each surface having a pair of short sides and a pair of long sides, the second rectangular shaped semiconductor chip comprising: a second pad disposed along a first lower surface short side of the second rectangular shaped semiconductor chip, wherein the first and second rectangular shaped semiconductor chips are stacked so as to expose the first pad and the second pad on one side of the stacked first and second rectangular shaped semiconductor chips; and a substrate having a first connection pad facing the first pad and the second connection pad facing the second pad; and a first connection member connecting the first pad to the first connection pad; and a second connection member connecting the second pad to the second connection pad.

The stacked wafer level semiconductor package module may further comprise an adhesive member interposed between the first and second rectangular shaped semiconductor chips fixing the first rectangular shaped semiconductor chip to the second rectangular shaped semiconductor chip.

A first pad is also disposed along a second lower surface short side of the first rectangular semiconductor chip.

The first pad is a first edge bonding pad formed on a surface adjacent to the first lower surface short side of the first rectangular shaped semiconductor chip.

The second pad is also disposed along a second lower surface short side of the second rectangular shaped semiconductor chip.

The second pad is a second edge bonding pad formed on a surface adjacent to the first lower surface short side of the second rectangular shaped semiconductor chip.

The first semiconductor chip includes a center bonding pad disposed along a center portion of the lower surface between the first and second lower surface short sides of the first rectangular shaped semiconductor chip; and a first redistribution having a first end and a second end opposite the first end disposed on the lower surface of the first rectangular shaped semiconductor chip, wherein the first end is connected with the first center bonding pad and the second end is connected to the first pad.

The first rectangular shaped semiconductor chip further includes an insulation layer pattern having a first opening for exposing the first pad.

The second semiconductor chip includes a second center bonding pad disposed along a center portion of the lower surface between the first and second lower surface short sides of the second rectangular shaped semiconductor chip; and a second redistribution having a first end and a second end disposed on the lower surface of the second rectangular shaped semiconductor chip, wherein the first end is connected to the second center bonding pad and the second end is connected to the second pad.

The second rectangular shaped semiconductor chip further includes an insulation layer pattern having a second opening for exposing the second pad.

The first connection member is a solder layer and the second connection member is a solder ball.

The solder layer and an end portion of the solder ball are disposed over the same plane.

The stacked wafer level semiconductor package module may further comprise a molding member for covering the semiconductor chip module.

The stacked wafer level semiconductor package module may further comprise a heat radiating member for covering the semiconductor chip module.

DESCRIPTION OF SPECIFIC EMBODIMENTS

Figure 1:
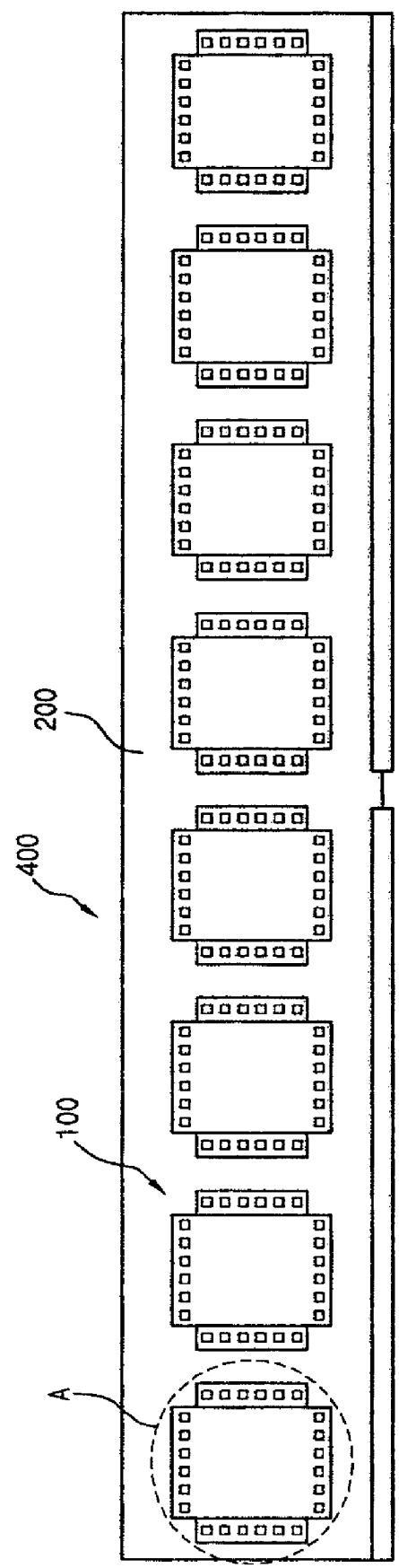
FIG. 1 is a plan view illustrating a stacked wafer level package module in accordance with an embodiment of the present invention.

FIG. 1 is a plan view illustrating a stacked wafer level package module according to an embodiment of the present invention.

Referring to FIG. 1, a stacked wafer level package module 400 includes a semiconductor chip module 100 and a substrate 200. In addition, the stacked wafer level package module 400 may further include a connection member 300 (see FIG. 7) for connecting the semiconductor chip module 100 to the substrate 200.

Figure 2:
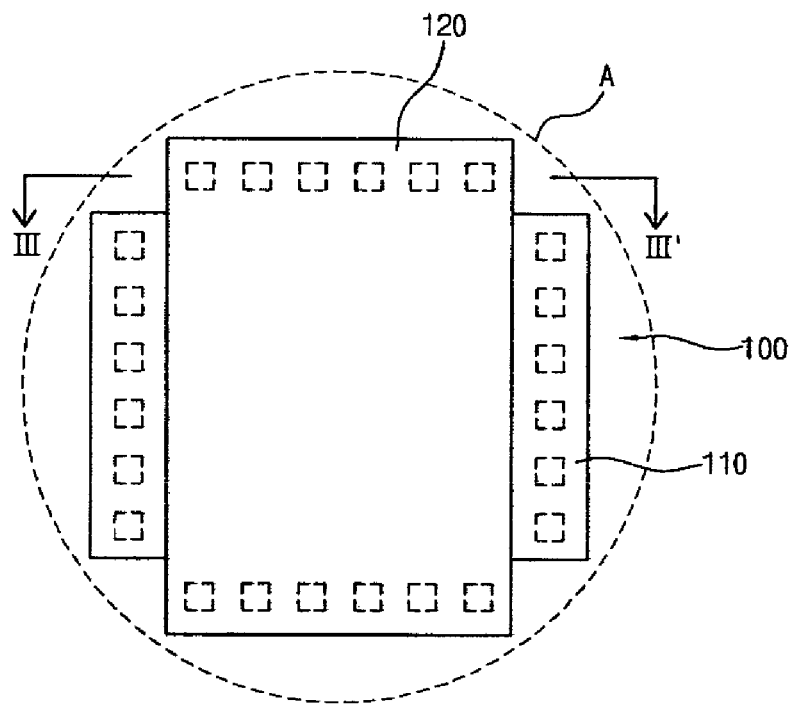
FIG. 2 is an enlarged view of a portion 'A' of FIG. 1.
Figure 3:
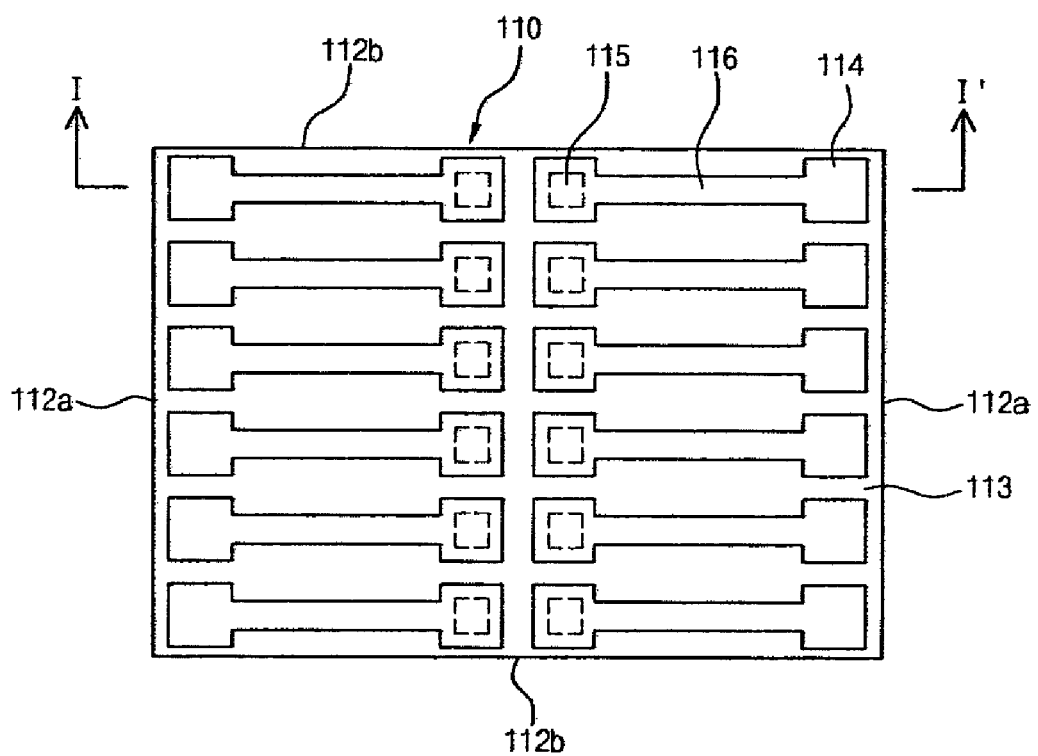
FIG. 3 is a plan view illustrating a first semiconductor chip of FIG. 2.
Figure 4:
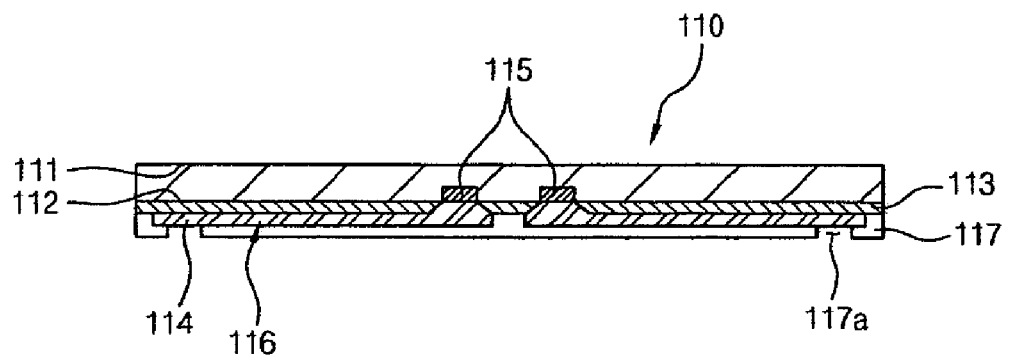
FIG. 4 is a cross-sectional view taken along the line I-I' of FIG. 3.

FIG. 2 is an enlarged view of a portion 'A' of FIG. 1. FIG. 3 is a plan view illustrating a first semiconductor chip of FIG. 2. FIG. 4 is a cross-sectional view taken along the line I-I' of FIG. 3.

Referring to FIG. 2, the semiconductor chip module 100 includes a first semiconductor chip 110 and a second semiconductor chip 120. The semiconductor chip module 100 may further include an adhesive member interposed between the first and second semiconductor chips 110 and 120 (not shown).

Referring to FIGS. 3 and 4, the first semiconductor chip 110 may have a rectangular parallelepiped shape (a rectangular prism shape). The first semiconductor chip 110 includes an upper surface 111 and a lower surface 112 opposite the upper surface 111.

The first semiconductor chip 110 has a rectangular shape when viewed from the top thereof as shown in FIG. 3. The lower surface 112 is defined by two first short sides 112a and two first long sides 112b. Each first short side 112a is connected with the first long sides 112b.

For example, the first semiconductor chip 110 includes a first circuit part (not shown), a first pad 114, a first center bonding pad 115 and a first redistribution 116. The first semiconductor chip 110 also includes a first insulation layer pattern 113 and a second insulation layer pattern 117 as shown in FIG. 4.

The first circuit part includes a first data storage part (not shown) for storing data and a first data processing part (not shown) for processing the data.

The first center bonding pads 115 are disposed along a center portion of the lower surface 112 of the first semiconductor chip 110 and each first center bonding pad 115 is connected to the first circuit part.

The first pads 114 are disposed along a first short side 112a of the lower surface 112 of the first semiconductor chip 110. The number of the first pads 114 corresponds to the number of the first center bonding pads 115.

The first redistributions 116 are disposed on the lower surface 112 of the first semiconductor chip 110 and the first redistributions 116 connect the first pads 114 to the first center bonding pads 115.

In the present embodiment, the first pad 114 and the first redistribution 116 may be integrally formed together.

The first insulation layer pattern 113 is interposed between the lower surface 112 of the first semiconductor chip 110 and the first redistribution 116, and the first insulation layer pattern 113 has an opening (not shown) for exposing the first center bonding pad 115. In the present embodiment, the first insulation layer pattern 113 may be an organic layer or an inorganic layer.

The second insulation layer pattern 117 covers the first redistribution 116 and the second insulation layer pattern 117 has an opening 117a for exposing the first pad 114. In the present embodiment, the second insulation layer pattern 117 may be an organic layer or an inorganic layer.

Figure 5:
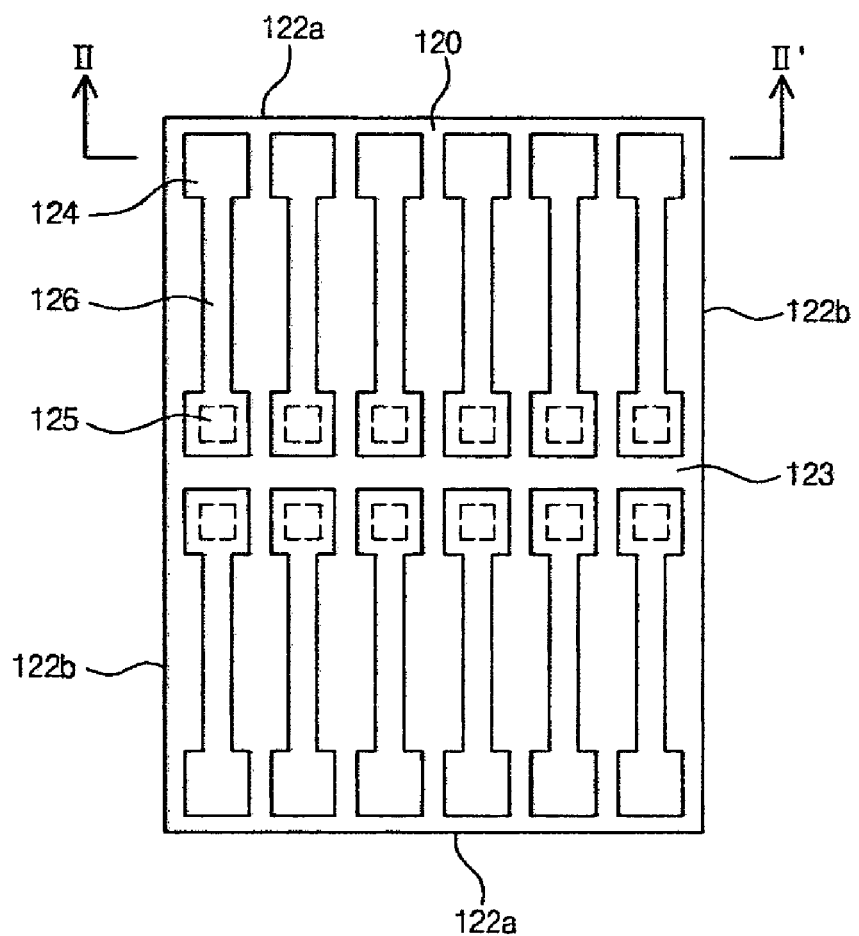
FIG. 5 is a plan view illustrating a second semiconductor chip of FIG. 2.
Figure 6:
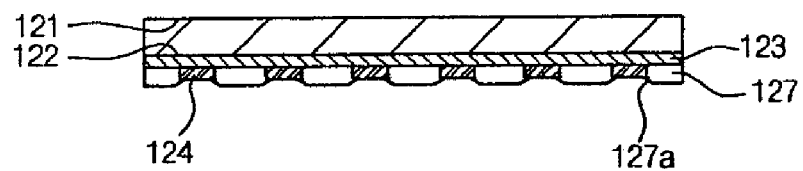
FIG. 6 is a cross-sectional view taken along the line II-II' of FIG. 5.

FIG. 5 is a plan view illustrating a second semiconductor chip 120 of FIG. 2. FIG. 6 is a cross-sectional view taken along the line II-II' of FIG. 5.

Referring to FIGS. 5 and 6 the second semiconductor chip 120 may have a rectangular parallelepiped shape. The second semiconductor chip 120 includes an upper surface 121 and a lower surface 122 opposite to the upper surface 121.

The second semiconductor chip 120 has a rectangular shape when viewed from the top thereof as shown in FIG. 5. The lower surface 122 is defined by two second short sides 122a and two second long sides 122b. Each second short side 122a is connected with the second long sides 122b.

For example, the second semiconductor chip 120 includes a second circuit part (not shown), a second pad 124, a second center bonding pad 125 and a second redistribution 126. The second semiconductor chip 120 also includes a first insulation layer pattern 123 and a second insulation layer pattern 127.

The second circuit part includes a second data storage part (not shown) for storing data and a second data processing part (not shown) for processing the data.

The second center bonding pads 125 are disposed along a center portion of the lower surface 122 of the second semiconductor chip 120 and each second center bonding pad 125 is connected to the second circuit part.

The second pads are disposed along a second short side 122a of the lower surface 122 of the second semiconductor chip 120. The number of the second pad 124 corresponds to the number of the second center bonding pads 125.

The second redistributions 126 are disposed over the lower surface 122 of the second semiconductor chip 120 and the second redistributions 126 connect the second pads 124 and the second center bonding pads 125.

In the present embodiment, the second pad 124 and the second redistribution 126 may be integrally formed together.

The first insulation layer pattern 123 is interposed between the lower surface 122 of the second semiconductor chip 120 and a second redistribution 126, and the first insulation layer pattern 123 has an opening (not shown) for exposing the second center bonding pad 125. In the present embodiment, the first insulation layer pattern 123 may include an organic layer or an inorganic layer.

The second insulation layer pattern 127 covers the second redistribution 126 and the second insulation layer pattern 127 has an opening 127a for exposing the second pad 124. In the present embodiment, the second insulation layer pattern 127 may include an organic layer or an inorganic layer.

In the present embodiment, the first semiconductor chip 110 and the second semiconductor chip 120 shown in FIG. 2 may be the same kind of a semiconductor chip or different kinds of semiconductor chips.

Referring again to FIG. 2, the second semiconductor chip 120 is disposed over the first semiconductor chip 110 in such a way that the second short side 122a of the second semiconductor chip 120 and the first short side 112a of the first semiconductor chip 110 are disposed perpendicular to each other. Orienting the chips as described above allows both the second pads 124 of the second semiconductor chip 120 and the first pads 114 of the first semiconductor chip 110 to be exposed.

Meanwhile, an adhesive member (not shown) may be interposed between the first semiconductor chip 110 and the second semiconductor chip 120 to fix the first and second semiconductor chips 110, 120 to each other.

In the present embodiment, the first semiconductor chip 110 and the second semiconductor chip 120, as described above, may further include first and second edge bonding pads disposed along the surfaces adjacent to the first and second short sides 112a and 122a of the first and second semiconductor chips 110 and 120 respectively.

Figure 7:
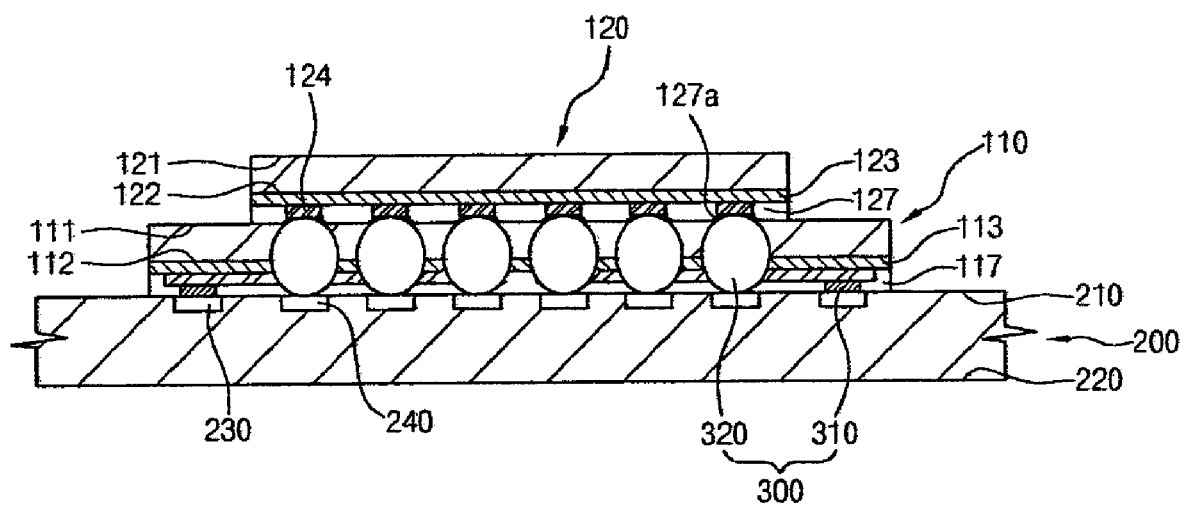
FIG. 7 is a cross-sectional view taken along the line III-III' of FIG. 2.
Figure 8:
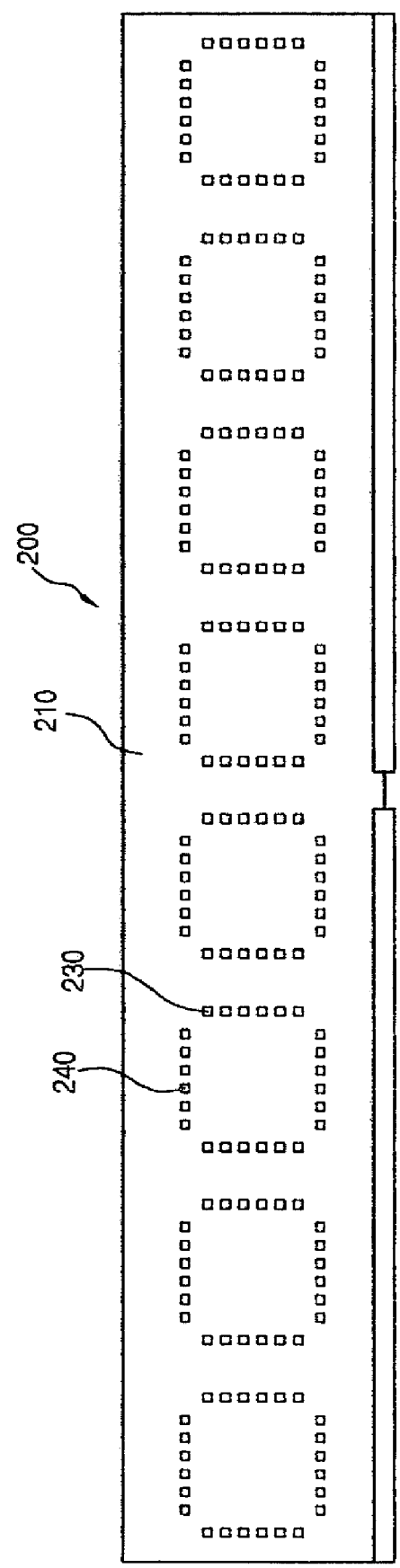
FIG. 8 is a cross-sectional view illustrating a substrate of FIG. 1.

FIG. 7 is a cross-sectional view taken along the line III-III' of FIG. 2. FIG. 8 is a plan view illustrating a substrate of FIG. 1.

Referring to FIGS. 7 and 8, the substrate 200 may be printed circuit board having a planar shape. The substrate 200 is connected with the semiconductor chip module 100 including the first and second semiconductor chips 110 and 120.

The substrate 200 includes an upper surface 210 and a lower surface 220 opposite the upper surface 210. First connection pads 230 and second connection pads 240 are disposed over the upper surface 210 of the substrate 200.

The first connection pads 230 are disposed over the upper surface 210 of the substrate 200. The number of first connection pads 230 is, for example, substantially the same as the number of first pads 114 of the first semiconductor chip 110. Each first connection pad 230 is disposed at a position corresponding to a first pad 114.

The second connection pads 240 are disposed over the upper surface 210 of the substrate 200. The number of second connection pads 240 is, for example, substantially the same as the number of second pads 124 of the second semiconductor chip 120. Each second connection pad 240 is disposed at a position correspond to a second pad 124.

Referring again to FIG. 7, the connection member 300 includes a first connection member 310 and a second connection member 320.

The first connection member 310 is interposed between the first pad 114 of the first semiconductor chip 110 and the first connection pad 230 of the substrate 200. The first connection member 310 connects the first pad 114 and the first connection pad 230. In the present embodiment, the first connection member 310 may be disposed over the first pad 114. Alternatively, the first connection member 310 may be disposed over the first connection pad 230.

In the present embodiment, the first connection member 310 can be formed in a variety of shapes, such as a thin film or a solder ball. In the present embodiment, when the first connection member 310 is formed in a shape of a thin film, the volume of the stacked wafer level package module 400 can further reduced The second connection member 320 is interposed between the second pad 124 of the second semiconductor chip 120 and the second connection pad 240 of the substrate 200. The second connection member 320 connects the second pad 124 and the second connection pad 240. In the present embodiment, the second connection member 320 may be disposed over the second pad 124. Alternatively, the second connection member 320 may be disposed over the second connection pad 240.

For Example, in the present embodiment, the second connection member 320 is formed in a spherical shape, and the second connection member 320 may include a solder ball.

Figure 9:
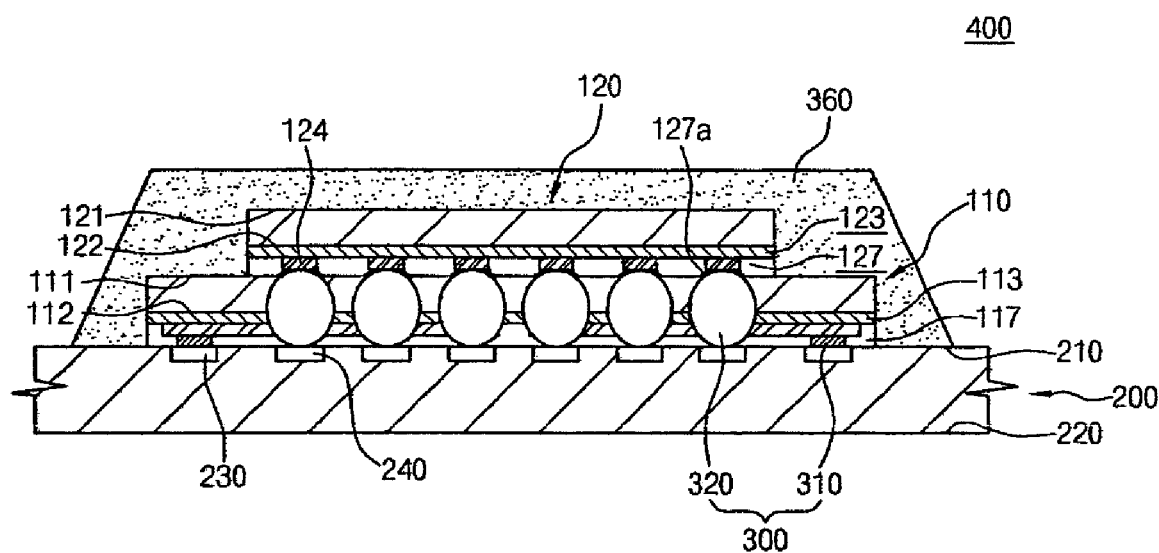
FIG. 9 is a cross-sectional view illustrating a stacked wafer level package module in accordance with another embodiment of the present invention.

FIG. 9 is a cross-sectional view illustrating a stacked wafer level package module in accordance with another embodiment of the present invention. The stacked wafer level package module in accordance with another embodiment of the present invention has substantially the same structure as the stacked wafer level package module described with reference to FIGS. 1 through 8, but also includes a molding member. Therefore, description to the same components will be omitted and the same name and reference numeral will be given to the same component.

Referring to FIG. 9, a stacked wafer level package module 400 includes a semiconductor chip module 100, a substrate 200, a connection member 300 and a molding member 360.

The molding member 360 protects the semiconductor chip module 100 disposed over the substrate 200. For example, the semiconductor module 100 may include very brittle first and second semiconductor chips 110 and 120 that are exposed to the outside over the substrate 200. Such a semiconductor module 10 may be damaged or broken by an external force or vibration.

In the present embodiment the semiconductor module 100 is disposed over the substrate 100 and is encapsulated by the molding member 360 to protect against damage caused by external force or vibration. The molding member may include an epoxy resin.

Figure 10:
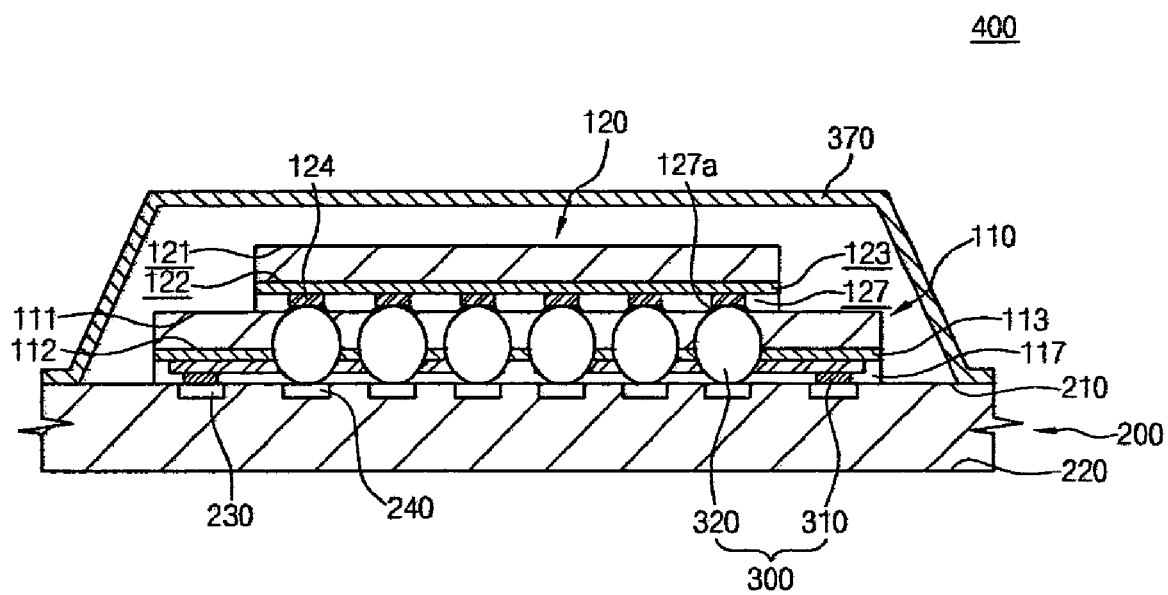
FIG. 10 is a plan view illustrating a stacked wafer level package module in accordance with further another embodiment of the present invention.

FIG. 10 is a cross-sectional view illustrating a stacked wafer level package module in accordance with another embodiment of the present invention. The stacked wafer level package module has substantially the same structure as the stacked wafer level package module described with reference to FIGS. 1 through 8, but also includes a heat radiating member. Therefore, description to the same components will be omitted and the same name and reference numeral will be given to the same component.

Referring to FIG. 10, a stacked wafer level package module 400 includes a semiconductor chip module 100, a substrate 200, a connection member 300 and a heat radiating member 370.

The semiconductor chip module 100 includes a first semiconductor chip 110 and a second semiconductor chip 120 disposed over the first semiconductor chip 110. The first and second semiconductor chips 110 and 120 each have a rectangular parallelepiped shape.

Heat dissipation properties of the first and second semiconductor chips 110 and 120 are reduced when the second semiconductor chip 120 is disposed over the first semiconductor chip 110. Consequently, the performance of the first and second semiconductor chips 110 and 120 may be largely reduced.

The semiconductor chip module 100 is covered by a heat radiating member 370 to dissipate heat generated by the first and second semiconductor chips 110 and 120 and thereby prevent performance reduction due to excess heat. The heat radiating member 370 may be formed of a material having high thermal conductivity such as brass, aluminum, or an aluminum alloy. The heat radiating member 370 quickly radiates the heat generated by the first and second semiconductor chips 110 and 120 and also prevents the semiconductor module 100 from being damaged by an external force or vibration. In the present embodiment, it may be possible to interpose the molding member 360 between the radiating member 370 and the semiconductor chip module 100.

The present invention improves data storage capacity and data processing speed by utilizing multi-layer wafer level packages mounted over a substrate Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A stacked wafer level semiconductor package module, comprising:

a semiconductor chip module comprising:
- a first rectangular shaped semiconductor chip having a first pad disposed along a first lower surface short side of the first rectangular shaped semiconductor chip; and
- a second rectangular shaped semiconductor chip having a second pad disposed along a first lower surface short side of the second rectangular shaped semiconductor chip,
- wherein the first and second rectangular shaped semiconductor chips are stacked so as to expose the first pad and the second pad; and a substrate having a first connection pad facing the first pad and a second connection pad facing the second pad, wherein the substrate has a plate shape;

a first connection member connecting the first pad and the first connection pad;

a second connection member connecting the second pad and the second connection pad, and a heat radiating member attached on the substrate including the first and second semiconductor chips such that the heat radiating member covers the first and second semiconductor chips.

2. The stacked wafer level semiconductor package module according to claim 1, further comprising an adhesive member interposed between the first and second rectangular shaped semiconductor chips fixing the first rectangular shaped semiconductor chip to the second rectangular shaped semiconductor chip.

3. The stacked wafer level semiconductor package module according to claim 1, wherein a first pad is also disposed along a second lower surface short side of the first rectangular shaped semiconductor chip.

4. The stacked wafer level semiconductor package module according to claim 3, wherein the first pad is a first edge bonding pad formed on a surface adjacent to the first lower surface short side of the first rectangular shaped semiconductor chip.

5. The stacked wafer level semiconductor package module according to claim 1, wherein a second pad is also disposed along a second lower surface short side of the second rectangular shaped semiconductor chip.

6. The stacked wafer level semiconductor package module according to claim 5, wherein the second pad is a second edge bonding pad formed on a surface adjacent to the first lower surface short side of the second rectangular shaped semiconductor chip.

7. The stacked wafer level semiconductor package module according to claim 1, wherein the first rectangular shaped semiconductor chip further comprises:
- a first center bonding pad disposed along a center portion of a lower surface of the first rectangular shaped semiconductor chip; and a first redistribution disposed on the lower surface of the first rectangular shaped semiconductor chip and connected to the first center bonding pad and the first pad.

8. The stacked wafer level semiconductor package module according to claim 7, wherein the first rectangular shaped semiconductor chip further includes an insulation layer pattern having a first opening for exposing the first pad.

9. The stacked wafer level semiconductor package module according to claim 1, wherein the second rectangular shaped semiconductor chip further comprises:
- a second center bonding pad disposed along a center portion of a lower surface of the second rectangular shaped semiconductor chip; and
- a second redistribution disposed on the lower surface of the second rectangular shaped semiconductor chip connected to the second center bonding pad and the second pad.

10. The stacked wafer level semiconductor package module according to claim 9, wherein the second rectangular shaped semiconductor chip further includes an insulation layer pattern having a second opening for exposing the second pad.

11. The stacked wafer level semiconductor package module according to claim 1, wherein the first connection member is a solder layer and the second connection member is a solder ball.

12. The stacked wafer level semiconductor package module according to claim 11, wherein the solder layer and an end portion of the solder ball are disposed over the same plane.

13. The stacked wafer level semiconductor package module according to claim 1, further comprising a molding member for covering the semiconductor chip module.

* * * * *